United States Patent
Vepsäläinen et al.

(10) Patent No.: US 7,453,927 B2
(45) Date of Patent: Nov. 18, 2008

(54) METHOD AND APPARATUS TO COMPENSATE AM-PM DELAY MISMATCH IN ENVELOPE RESTORATION TRANSMITTER

(75) Inventors: Jussi Vepsäläinen, Helsinki (FI); Miikka Hämäläinen, Espoo (FI)

(73) Assignee: Nokia Corporation, Espoo (FI)

( * ) Notice: Subject to any disclaimer, the term of this patent is extended or adjusted under 35 U.S.C. 154(b) by 590 days.

(21) Appl. No.: 10/672,733

(22) Filed: Sep. 26, 2003

(65) Prior Publication Data

US 2005/0069026 A1 Mar. 31, 2005

(51) Int. Cl.
*H04B 1/38* (2006.01)
*H04B 3/46* (2006.01)
(52) U.S. Cl. ..................... 375/219; 375/224
(58) Field of Classification Search ......... 375/219–223, 375/271, 285, 224; 455/102, 126, 67.16, 455/69; 348/442
See application file for complete search history.

(56) References Cited

U.S. PATENT DOCUMENTS

2002/0058486 A1* 5/2002 Persson .................... 455/150.1
2002/0082792 A1* 6/2002 Bourde et al. ............... 702/107
2002/0105378 A1* 8/2002 Tapio ......................... 330/10
2002/0168020 A1 11/2002 Justice et al. ............... 375/295
2003/0118143 A1* 6/2003 Bellaouar et al. ........... 375/376
2004/0219891 A1* 11/2004 Hadjichristos .............. 455/102

OTHER PUBLICATIONS

"Digital Multimode Technology Redefines the Nature of RF Transmission", Applied Microwave & Wireless, Aug. 2001, 7 pages.

* cited by examiner

*Primary Examiner*—Don N Vo
(74) *Attorney, Agent, or Firm*—Harrington & Smith, PC

(57) ABSTRACT

An RF transceiver includes an Envelope Restoration (ER) transmitter (TX) and a receiver (RX). A method includes providing the TX with a programmable delay element in at least one of an AM path and a PM path; making an RF connection between an output of the TX and an input of the RX; and when receiving a signal through the RF connection, determining a delay value for use in programming the programmable delay element. The method includes measuring an effect on a parameter of a delay mismatch between the AM path and the PM path for use in determining the delay value. Adjacent Channel Leakage Ratio (ACLR); Own-Channel Power (OCP) or Bit Error Ratio (BER) may be measured in this regard. When measuring ACLR, delay is adjusted to minimize ACLR; when measuring OCP, delay is adjusted to maximize OCP; and when measuring BER, delay is adjusted to minimize BER.

35 Claims, 9 Drawing Sheets

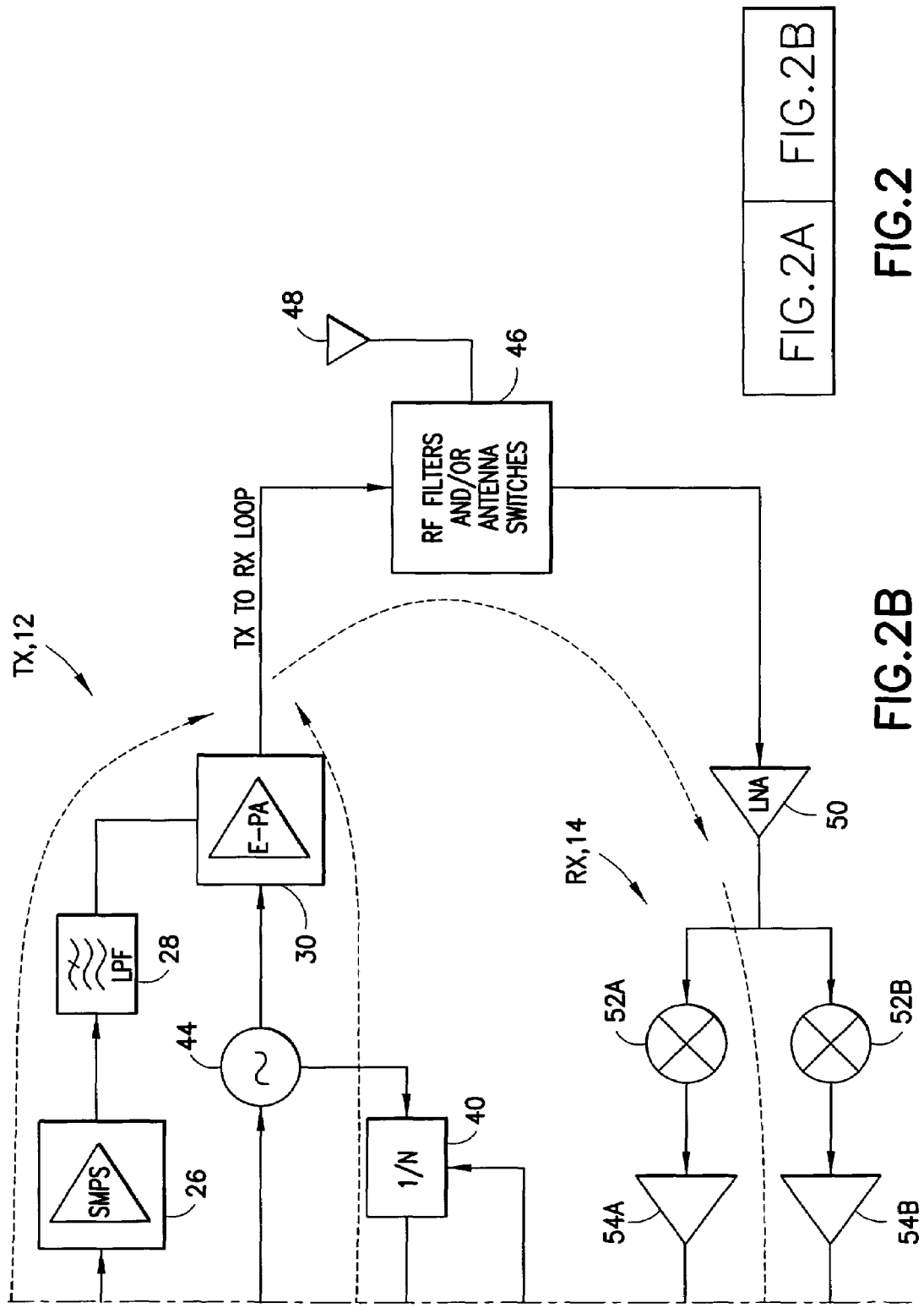

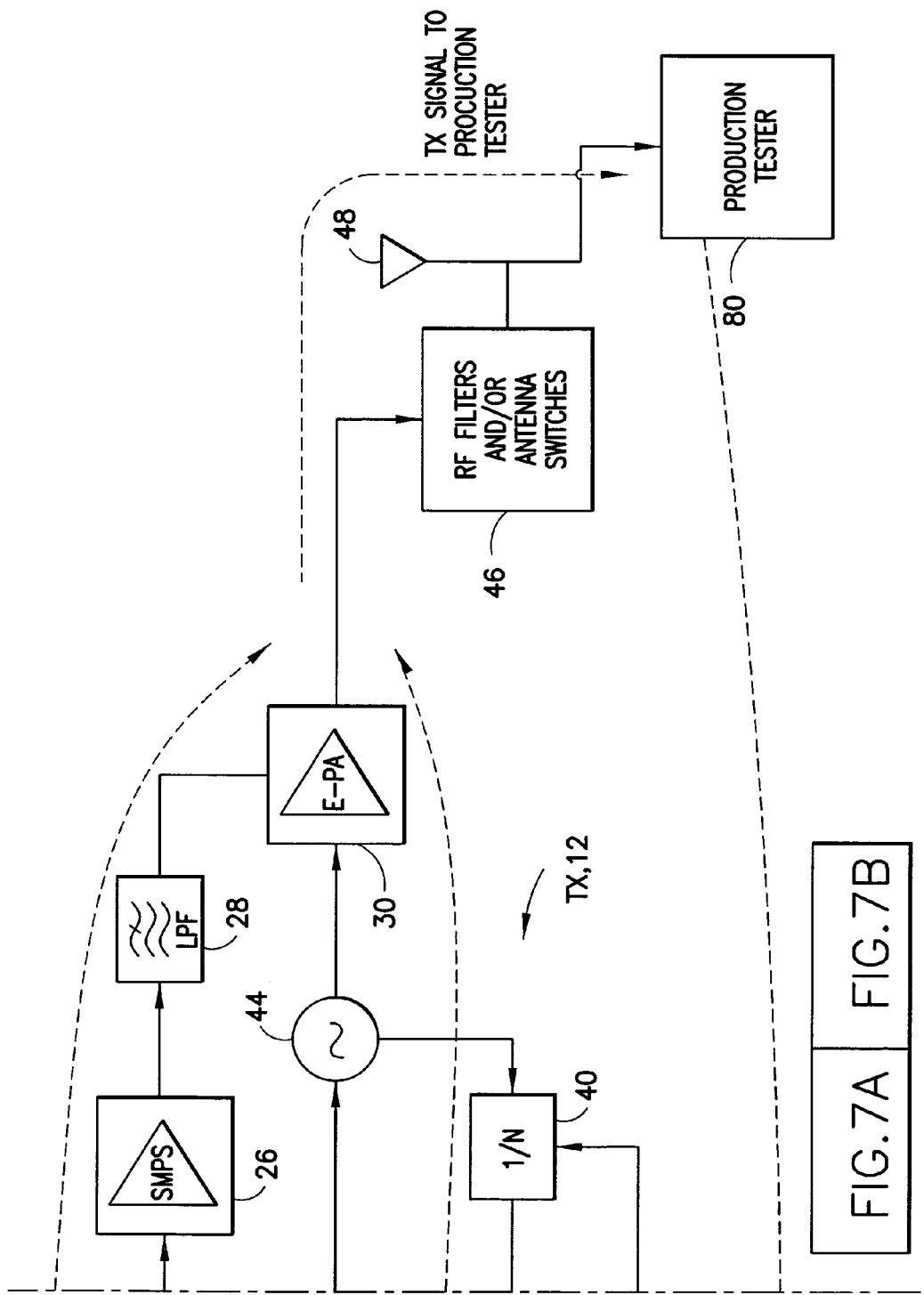

METHOD AND APPARATUS TO COMPENSATE AM-PM DELAY MISMATCH IN ENVELOPE RESTORATION TRANSMITTER

TECHNICAL FIELD

This invention relates generally to radio frequency (RF) transmitters, such as RF transmitters for cellular mobile stations, and, more specifically, relates to envelope restoration (ER) RF transmitters where a symbol is represented using phase and amplitude components, rather than complex In-phase/Quadrature Phase (I/Q) components.

BACKGROUND

FIG. 1 is a simplified block diagram showing an ER transmitter (TX) 1 architecture that includes an amplitude modulation (AM) chain and a phase modulation (PM) chain. Bits to be transmitted are input to a bits to polar converter 2 that outputs an amplitude signal to an amplitude modulator (AM) 4. The AM 4 (after digital to analog conversion) supplies a signal for controlling the output level of a TX power amplifier (PA) 6 through the use of a controllable power supply 5. The bits to polar converter 2 also outputs a phase signal to a frequency modulator (FM) 7, which in turn outputs a signal via a phase locked loop (PLL) to the input of the PA 6. The transmitted signal at an antenna 9 is thus generated by simultaneously using both phase and amplitude components. The benefits that can be gained by using the ER transmitter architecture include a smaller size and an improved efficiency.

However, it has been recognized that the ER-based system is sensitive to the propagation time difference between the AM and PM chains. The existence of the propagation time difference generates undesired effects in the ER transmitter 1. For example, the adjacent channel leakage ratio (ACLR) level at the TX antenna 9 may exceed the acceptable levels required by cellular system specifications, where ACLR defines the ratio between the transmitted channel signal in-band signal and the level of the leaking interference signal into neighboring channels. Furthermore, the existence of the propagation time difference can result in an increase in the error vector magnitude (EVM), which is manifested at the receiver as an increase in the bit error ratio (BER), which can be expressed as the number of erroneously received bits divided by the total number of received bits. The EVM results from the fact that a received symbol may not correspond precisely to an ideal symbol shown in a constellation diagram due to noise associated with the communication channel and imperfections of both the transmitter and receiver. The difference between a received symbol and an ideal symbol can be represented as an error vector (EV). Generally, the smaller the magnitude of the error vector, the better the performance of the communication system. The EVM is the root mean square (RMS) value of the error vector over time at the precise time instant of the symbol clock transitions. EVM is typically normalized to either the amplitude of the outermost symbol, or the square root of the average symbol power.

Each symbol may be represented as a particular amplitude and phase. Thus, the transmitted signal may vary in amplitude and/or phase to transmit a string of consecutive symbols, and the amplitude and phase components of a signal may be processed separately in a transmitter (as shown in FIG. 1). The EVM for a communication system can vary based on the delay applied between the amplitude of the transmitted signal and the phase of the transmitted signal.

Justice et al., in U.S. Patent Application Publication U.S. 2002/0168020 A1, describe the use of a processor with a delay adjustment module to adjust the delay between the amplitude and phase components of the signal to be transmitted. This is done based on the transmit power of the information signal. In practice, the delay value is selected to minimize the combination of the EVM and the ACPR (Adjacent Channel Power Ratio).

With regard to the delays between the AM and PM chains, it can be shown that the required time resolution is 1/128 of the symbol time in the EDGE (Enhanced Data rate for Global Evolution) type cellular system, and 1/64 of the symbol time in the WCDMA (Wideband Code Division, Multiple Access) type cellular system. For example, for the WCDMA system the time resolution is about 4.07 ns, a value that is too small to be directly measured in a practical manner within the mobile station.

SUMMARY OF THE PREFERRED EMBODIMENTS

The foregoing and other problems are overcome, and other advantages are realized, in accordance with the presently preferred embodiments of these teachings.

The inventors have realized that it would be most advantageous to measure the actual result of the delay mismatch when using a transmitter that represents symbols using both phase and amplitude information. The inventors have further realized that it would not be advantageous to provide additional circuitry in the mobile station to perform the delay result measurement function, e.g., circuitry required to down convert the TX RF signal to baseband (BB) so that delay matching can be accomplished.

In accordance with an aspect of this invention, the transmitted signal is looped back to the mobile station receiver, and the mobile station receiver is used to detect the result of the delay mismatch in the mobile station transmitter so that the correct delay compensation value can be selected and applied to optimize both the ACLR and the EVM performance of the mobile station.

The ACLR can be measured using the mobile station receiver, and the delay adjusted to minimize the ACLR. In another embodiment the delay can be adjusted to maximize the own-channel power (OCP), thereby minimizing the signal power that leaks into other (adjacent) channels. It is also within the scope of this invention to measure the BER, and to adjust the delay to minimize the BER. The invention can be practiced to also minimize a combination of the ACLR and the BER, or the OCP and the BER.

Disclosed herein is a method, and a transceiver, and a mobile station that includes the transceiver, and a software program for operating a mobile station. For example, the method operates an RF transceiver that is coupled to, or capable of being coupled to, an antenna. The RF transceiver includes an ER transmitter (TX) and a receiver (RX). The method includes providing the TX with at least one programmable delay element in at least one of an AM path and a PM path; making an RF connection between an output of the TX and an input of the RX; and responsive to an output of the RX when receiving a signal through the RF connection, determining at least one delay value for use in programming the at least one programmable delay element. Making an RF connection includes measuring an effect of a delay mismatch between the AM path and the PM path for use in determining the at least one delay value. RF connection from TX to RX can be either galvanic or electro-magnetic.

In one embodiment measuring performs a power measurement such as an Adjacent Channel Leakage Ratio (ACLR) power measurement, the delay value is determined as being a value that minimizes the ACLR, and the RX is tuned, when receiving a signal through the RF connection, to an RX carrier frequency that is about one channel spacing away from a TX carrier frequency.

In another embodiment measuring performs an Own-Channel Power (OCP) measurement, the delay value is determined as being a value that maximizes the OCP, and the RX is tuned, when receiving a signal through the RF connection, to an RX carrier frequency that is substantially equal to a TX carrier frequency.

In another embodiment measuring performs a signal quality measurement, such as a Bit Error Ratio (BER) measurement, the delay value is determined as being a value that minimizes the BER, and the RX is tuned, when receiving a signal through the RF connection, to an RX carrier frequency that is substantially equal to a TX carrier frequency.

The RX can include at least one programmable filter, and the method may include programming the filter to have characteristics that differ when receiving a signal through the RF connection than when receiving a signal through the antenna.

In general, measuring the effect of the delay mismatch between the AM path and the PM path includes programming the at least one programmable delay element so as to have a plurality of different delay values within a range of delay values, and storing a recorded measurement value in combination with a current delay value.

The delay can be implemented either using a separate analog or digital delay element, or the programmable delay can be implemented as a part of the functionality of, for example, an analog or digital filter.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein.

DETAILED DESCRIPTION OF THE PREFERRED EMBODIMENTS

As was discussed above, the existence of a delay mismatch in AM and PM signal chains of the ER transmitter can degrade both the ACLR and the EVM performance. In accordance with an aspect of this invention, the effects of the delay mismatch are detected using the receiver after the TX signal is looped back to the receiver. In this manner the effects of the delay mismatch are detectable using existing RX measurement functions, and additional circuitry, cost and complexity are avoided.

Figure 1:
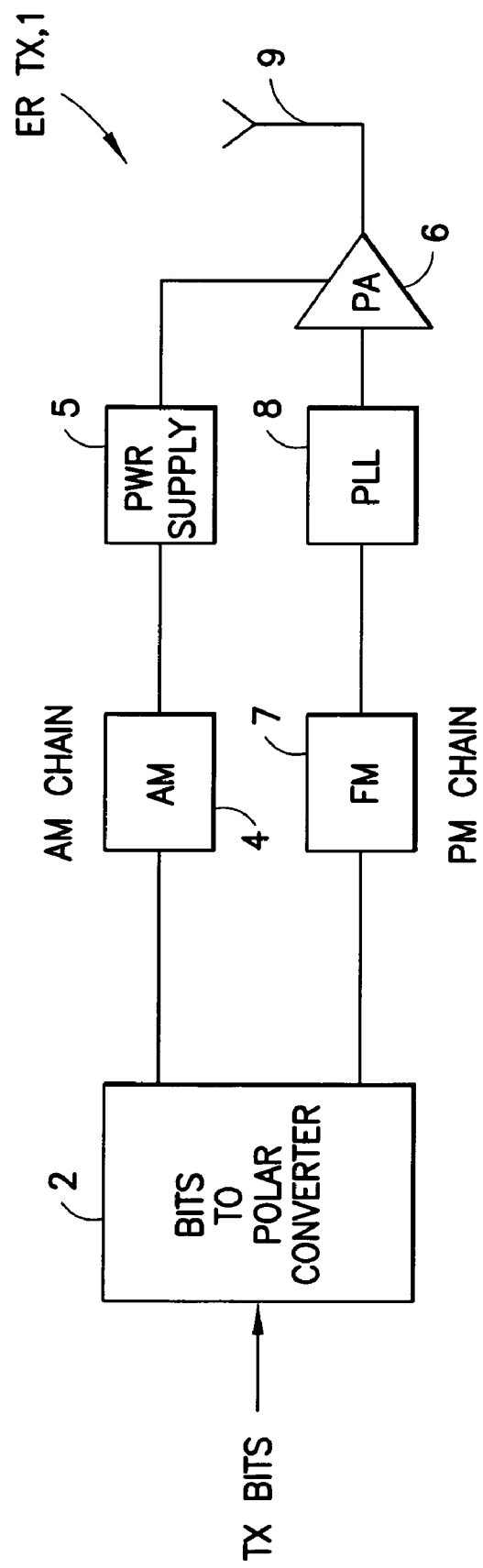
FIG. 1 is a block diagram of a conventional ER RF transmitter.
Figure 2A:
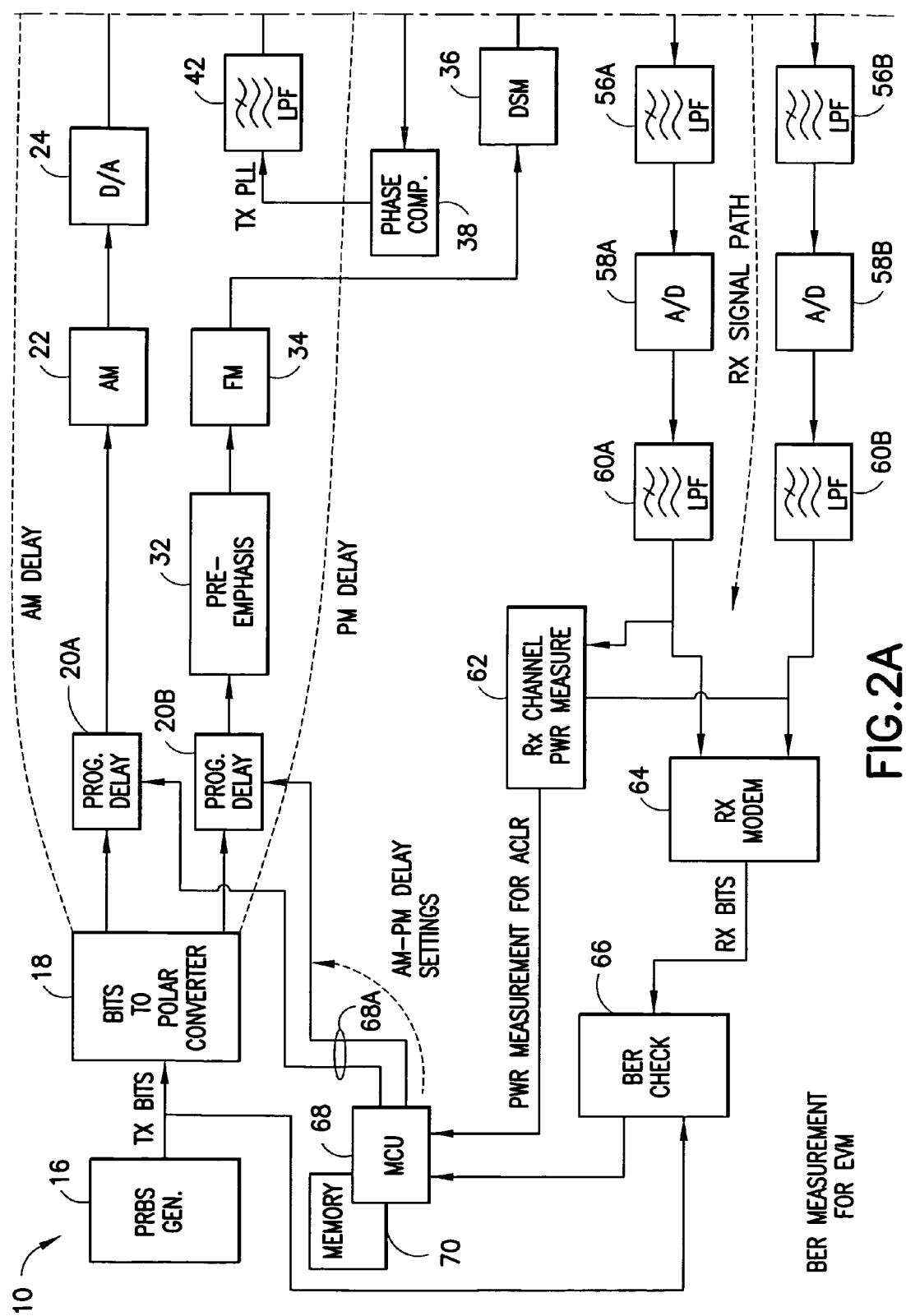
FIG. 2 is a block diagram of a mobile station ER RF transceiver where, in accordance with this invention, the receiver is used to make measurements for adjusting the AM and PM path delays.

FIG. 2 is a block diagram of an ER RF transceiver of a mobile station 10 where, in accordance with this invention, the receiver (RX) 14 is used to make measurements for adjusting the AM and PM path delays of the transmitter (TX) 12. As used herein, the term "mobile station" may include a cellular radiotelephone with or without a multi-line display; a Personal Communications System (PCS) terminal that may combine a cellular radiotelephone with data processing, facsimile and data communications capabilities; a PDA that can include a radiotelephone, pager, Internet/intranet access, Web browser, organizer, calendar and/or a global positioning system (GPS) receiver; and a conventional laptop and/or palmtop receiver or other information appliance that includes a radiotelephone transceiver.

In FIG. 2 a pseudo-random bit sequence (PRBS) generator 16 outputs TX bits to a bits to polar converter 18. The bits to polar converter 18 has two output channels, an amplitude modulation (AM) channel and a phase modulation (PM) channel, each having an associated controllable delay element 20A and 20B, respectively. Describing the AM channel first, the output from the programmable delay 20A is applied to an amplitude modulator 22, and then to a digital to analog converter (D/A) 24. The output of the D/A 24 is an analog control signal that is applied to a power supply, preferably a switched mode power supply (SMPS) 26, the output of which is low pass filtered (filter 28) before being connected to a TX power amplifier (PA) 30. By controlling the output of the SMPS 26 the output level of the PA 30 is controlled, thereby providing the desired AM function in the ER TX 12. Now describing the PM channel, the output from the programmable delay 20B is applied to a pre-emphasis block 32, and then to a frequency modulator (FM) 34. The output of the FM 34 is one input to a delta-sigma modulator (DSM) 36 that forms part of a voltage controlled oscillator (VCO) 44 control loop comprised of a phase locked loop (PLL) 38, 1/N divider 40 and LPF 42. The output of the VCO 44 is applied to the input of the PA 30, and forms the phase modulated portion of the transmitted signal. The output of the PA 30 is coupled to a block 46 containing RF filters (e.g., a duplex filter) and/or antenna switches, which in turn is coupled to an antenna 48. In accordance with an aspect of this invention the filter/switch block 46 is constructed to permit a signal path to exist from the output of the TX 12 to the input of the RX 14. This signal path can be made through a suitable attenuation (e.g., one that provides about 50 dB of attenuation), and is preferably switchable so that it exists only when commanded. In duplex systems, such as GSM, the 50 dB attenuation can be achieved by the TX to RX separation.

The RX 14 includes a low noise amplifier (LNA) 50 having an input coupled to the antenna 48 via the block 46. The output of the LNA 50 is applied to down conversion mixers 52A and 52B which feed parallel receiver signal paths including amplifiers 54A, 54B, LPFs 56A, 56B, analog to digital converters (A/Ds) 58A, 58B, and further LPFs 60A, 60B. The baseband output of the LPFs 60A, 60B is applied to an RX modem 64 that recovers and outputs the RX bits from the received signal. The RX bits are applied to a signal quality determination block, implemented in the presently preferred, but non-limiting, embodiment as a BER check unit 66. An output of the BER check unit 66 is coupled to a controller, such as a micro-control unit (MCU) 68 that contains or that is coupled with a memory 70. The baseband output of the LPFs 60A, 60B is also applied to an RX Channel Power (PWR) measurement block 62, having an output that is also coupled to the MCU 68.

It should be noted that the BER check unit 66 and the RX Channel PWR measurement block 62 are both circuit and/or software modules that are normally present in the RX 14, and are thus not provided specially for making the delay effect determination measurements in accordance with this invention.

In accordance with an aspect of this invention, the TX signal is looped or coupled through the block 46 so that the TX signal can be received at the input to the LNA 50. The RX 14 is thus used for measuring at least the ACLR (via PWR measurement block 62), and possibly also the EVM (via BER check block 66), and thus determining with the MCU 68, operating under control of a program stored in the memory 70, what the correct delay compensation value(s) should be to optimize at least one of the ACLR and the EVM performance of the mobile station 10. The MCU 68 is thus enabled to correctly set the programmable delay blocks 20A, 20B via programming buses 68A.

In one embodiment the procedure is as follows. The mobile station 10 operates to measure the signal that is leaked into the adjacent channel. This can be accomplished by using a TX 12 to RX 14 loop at RF that is made through the filter/switch block 46, as discussed above. The TX and RX carrier frequencies are provided with an offset that is approximately equal to the channel spacing used in the cellular system of interest (e.g., 5 MHZ for the WCDMA system). Since the RX 14 front end is tuned to be only about one channel width away from the TX channel frequency, some amount of the TX signal energy will enter the RX 14 and will be amplified and detected. After RX channel filtering the dominant part of the signal is the leaked portion, which is detected using the narrow band power measurement block 62 in the digital front end. During the measurement the AM-PM delay ratio is varied by the MCU 68, and the optimal ACLR is determined from the AM-PM delay ratio that results in the smallest amount of power in the received band (i.e., in the channel substantially adjacent to the TX channel).

In another embodiment the procedure is as follows. The mobile station 10 operates to measure the own-channel power (OCP), thereby minimizing the signal power that leaks into other (adjacent) channels. This can also be accomplished by using a TX 12 to RX 14 loop at RF. In this case the TX and RX carrier frequencies are provided with substantially zero offset. Since the RX 14 front end is tuned to be equal to the TX channel frequency, the TX signal energy will enter the RX 14 and will be amplified and detected. After RX channel filtering the dominant part of the signal is the TX OCP, which is detected, as in the first embodiment, using the narrow band power measurement block 62 in the digital front end. The leaked portion of the signal is filtered away. During the measurement the AM-PM delay ratio is varied by the MCU 68 and, in this case, the optimal ACLR is determined from the AM-PM delay ratio that results in the greatest amount of power in the received band (i.e., in the same or own-channel carrier level).

For the ACLR tests described above, it is preferred to maintain the TX power constant.

In a further embodiment a known PRBS, or other known bit pattern, is output from the PRBS generator 16, and the RX 14 and TX 12 are set to the same frequency. The TX signal is looped back through the TX 12 to, in this case, the RX modem 64. During the measurement the AM-PM delay ratio is varied by the MCU 68, and the output of the RX modem 64 is applied to the BER checker 66 which compares the output of the RX modem 64 with the TX bits output from the PRBS generator 16, and thus determines the BER. The smallest BER corresponds to the most optimum EVM, and the corresponding AM-PM delay is selected for use.

It should be noted that in FIG. 2 the TX signal is connected via the RF switches and/or RF filters 46 to the input of the LNA 50, but it is also within the scope of this invention to connect the TX signal to the input of the mixers 52A, 52B.

In that the TX to RX loop typically has an attenuation of up to about 50 dB, it is possible to test the loop with a wide range of different TX powers. However, if it is not required or desired to run the AM-PM delay test at the highest TX power levels, then the attenuation can be less. Since the TX signal goes through the RX 14 circuit chain, and since there is a frequency difference of the channel bandwidth (in the first embodiment), then the received power in the RX band is actually dominated by the ACL. In this case the smallest detected power in the RX band corresponds to the optimal ACLR.

Figure 3:
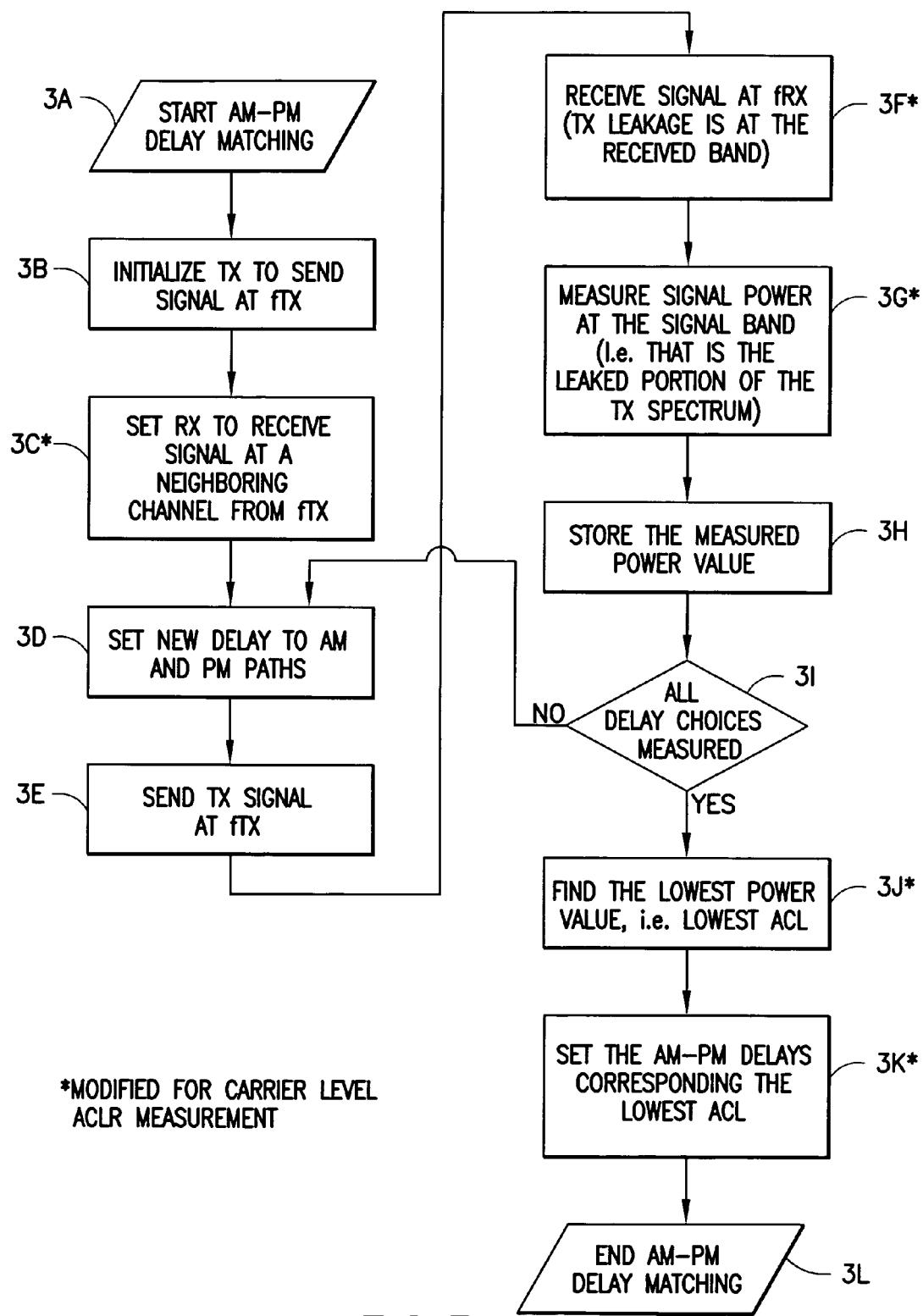
FIG. 3 is a logic flow diagram showing ACLR optimization using the ER RF transceiver of FIG. 2, where the transmit signal is looped back to the receiver with a frequency offset of (approximately) the channel bandwidth.

FIG. 3 is a flow diagram of the procedure carried out in cooperation with the MCU 68 for ACLR optimization. At block 3A the procedure is started, and at block 3B the TX 12 is initialized to transmit the signal at the transmit frequency ($f_{TX}$). At block 3C the RX 14 is set to receive the signal at a channel adjacent to $f_{TX}$. At block 3D a first (or subsequent) AM-PM delay value is programmed into one or both of the delays 20A, 20B, and at blocks 3E and 3F the TX signal is transmitted and received. At block 3G the signal power that has leaked from $f_{TX}$ into the adjacent signal band is measured by the PWR measurement block 62, and at block 3H the MCU 68 stores the measured power value in the memory 70 along with an indication of the corresponding AM-PM delay value. At block 3I a determination is made as to whether all desired delay values have been measured. If not, control passes back to block 3D to set the next delay value between the AM and PM channels, and to proceed as discussed above. If all desired delay values have been measured, at block 3J the MCU 68 determines the lowest stored measured power value, and at block 3K programs the delays 20A, 20B to reflect the corresponding delay value. At block 3L the AM-PM delay matching procedure is terminated.

It should be noted that for the own-channel power ACLR measurement technique described above, the procedure of FIG. 3 is modified at block 3C so that the RX 14 is set to receive the signal at the same channel as $f_{TX}$, block 3F. Block 3F receives the same channel signal, block 3G measures the carrier level signal (not the leaked signal from $f_{TX}$ to the adjacent channel), block 3J finds the highest power value (one that corresponds to a maximum carrier level), and block 3K sets the AM-PM delay values that correspond to the greatest measured own-channel power.

Figure 4:
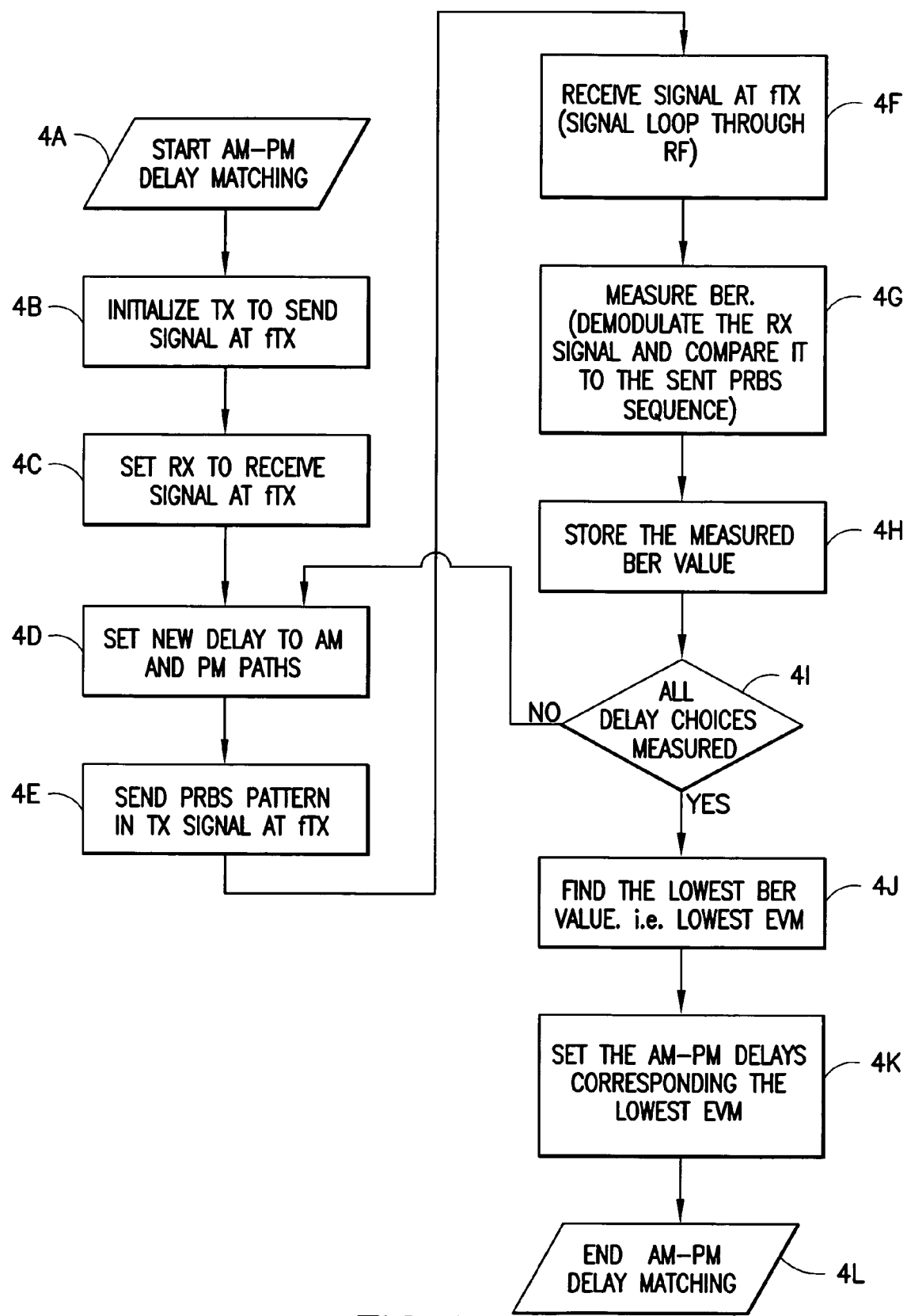
FIG. 4 is a logic flow diagram showing delay compensation when optimizing EVM.

FIG. 4 is a flow diagram of the procedure carried out in cooperation with the MCU 68 for EVM optimization. At block 4A the procedure is started, and at block 4B the TX 12 is initialized to transmit the signal at the transmit frequency ($f_{TX}$). At block 4C the RX 14 is set to receive the signal in the same frequency band (at $f_{TX}$). At block 4D a first (or subsequent) AM-PM delay value is programmed into one or both of the delays 20A, 20B, and at blocks 4E and 4F the TX signal is transmitted with the PRBS pattern and is received. At block 4G the BER is measured by demodulating the received signal in the RX modem 64 and comparing it in the BER check block 66 to the transmitted PRBS sequence. At block 4H the MCU 68 stores the measured BER value in the memory 70 along with an indication of the corresponding AM-PM delay value. At block 4I a determination is made as to whether all desired delay values have been measured. If not, control passes back to block 4D to set the next delay value between the AM and PM channels, and to proceed as discussed above. If all desired delay values have been measured, at block 4J the MCU 68 determines the smallest stored BER value (corresponding to the smallest EVM), and at block 4K programs the delays 20A, 20B to reflect the corresponding delay value. At block 4L the AM-PM delay matching procedure is terminated.

In general, the frequency settings in the RX 14 are made so that the receiver is capable of measuring relevant information from the transmitted signal. In the case of a direct conversion receiver (DCR) this implies tuning the RX Local Oscillator (LO) to the TX frequency. This frequency setting would normally be valid only when calibration is made internally, i.e., without an external production tester (described below in relation to FIG. 7).

Figure 5:
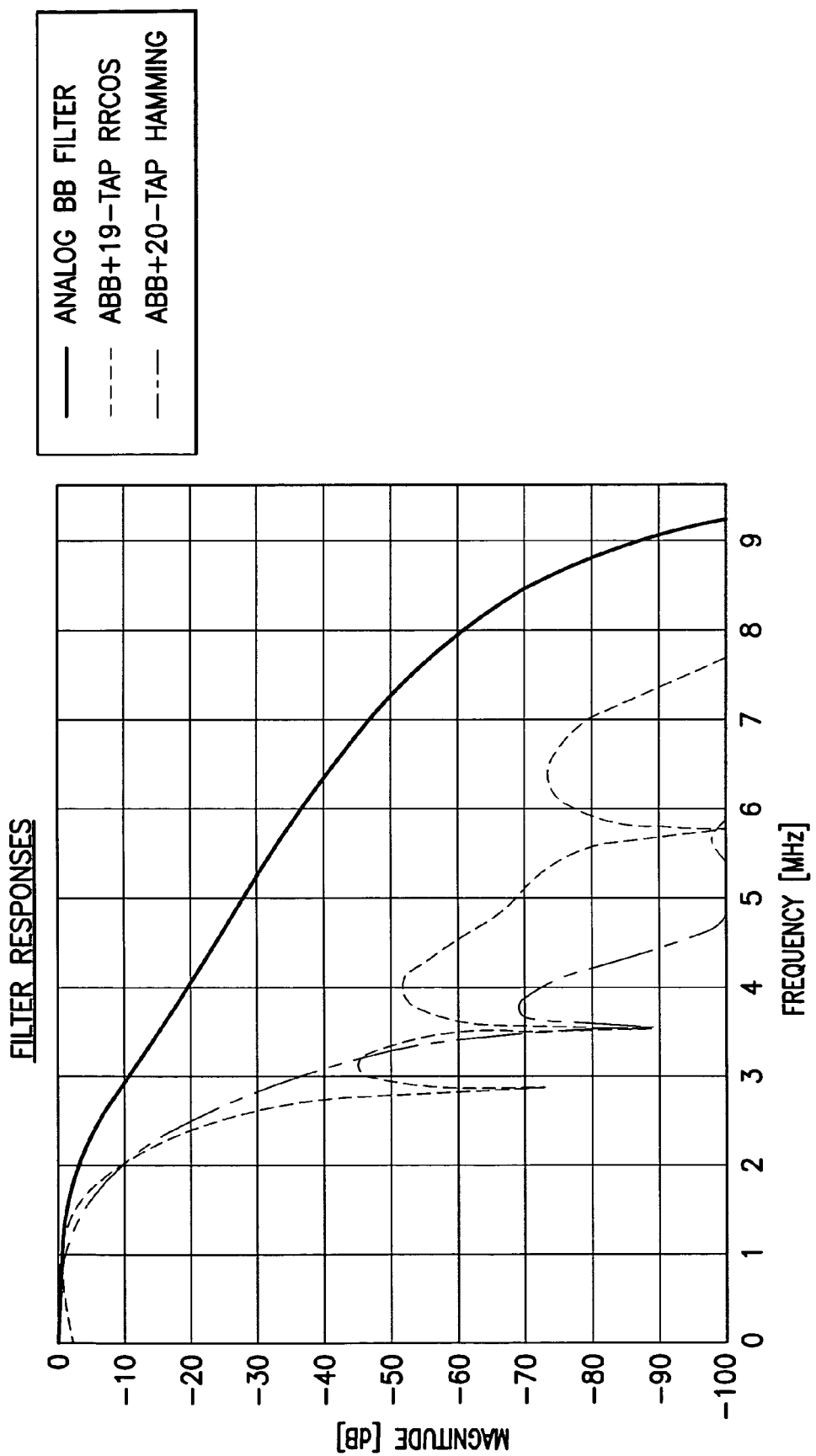
FIG. 5 is a graph depicting third order analog baseband filter response (solid line), channel selection using a 19-tap root raised cosine (RRCOS) filter (dashed line), and a 20-tap Hamming filter (dash-dot line)

Several channel filtering options can be present if the RX 14 includes a programmable Finite or Infinite Impulse Response (FIR or IIR) filter in the digital front end. Filtering during the ACLR optimization may be performed using the same filter as during normal operation, however using different coefficients for the filter may provide improved results. Optimizing the filter settings is best performed empirically, depending on the specifics of the RX 14 architecture and construction. As an example, FIG. 5 shows the frequency response of analog and digital channel filtering. The exemplary third order analog filter (filters 56A, 56B) is one combined from a first order Butterworth and a second order Chebyshew analog filter. The frequency responses of two different digital filters are also shown in FIG. 5, i.e., an exemplary 19-tap RRCOS filter and an exemplary 20-tap Hamming filter.

Figure 6:
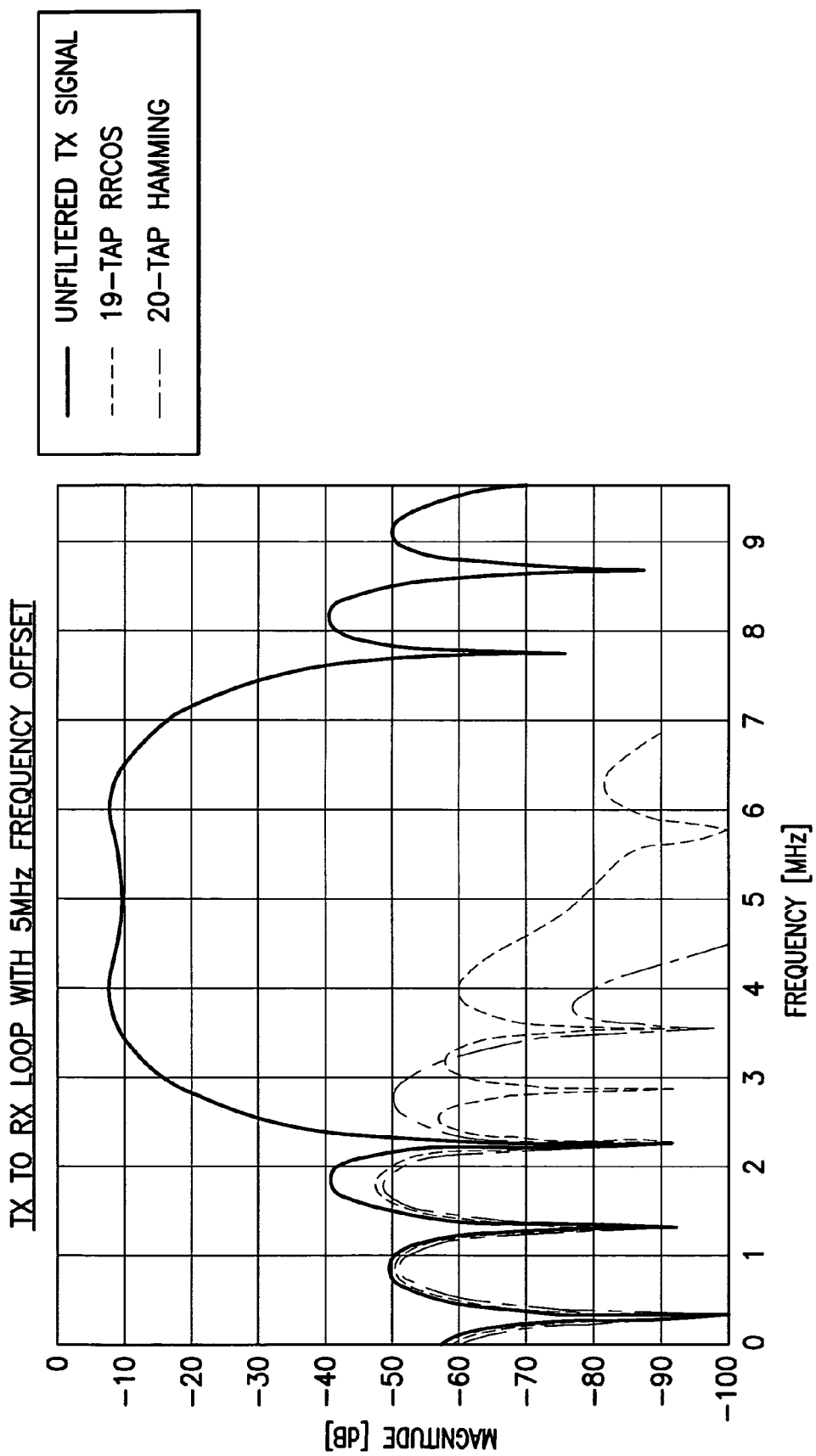
FIG. 6 is a graph depicting the (unfiltered) transmit signal looped back to the receiver with a 5 MHz frequency offset. (solid line), the received signal filtered with the 19-tap RRCOS filter (dashed line) and the 20-tap Hamming filter (dash-dot line)

FIG. 6 illustrates a WCDMA TX signal looped back to the RX 14 with a 5 MHz frequency offset. The TX signal is filtered out using the previously mentioned filters (FIG. 5), and the results of the filtering operations are shown in FIG. 6. The signal remaining in the RX 14 after filtering is predominately from the TX ACL, and is therefore a proper measure for ACLR minimization.

FIGS. 5 and 6 thus make it evident that the RX 14 filters may be programmed so as to be optimized for the ACLR and/or EVM-based AM-PM delay measurement and programming procedures, and that the filter characteristics and coefficients during the measurement process need not be the same as those used during normal signal reception.

It should be noted that the PRBS generation and BER checks are preferably implemented in digital signal processor (DSP) software, and thus add no additional complexity to the mobile station 10. In general, the addition of the ACLR and/or OCP measurement techniques, and/or the BER measurement technique, and the subsequent AM-PM delay calibration procedure, adds but a relatively small amount of complexity to the overall DSP/MCU software.

Figure 7A:
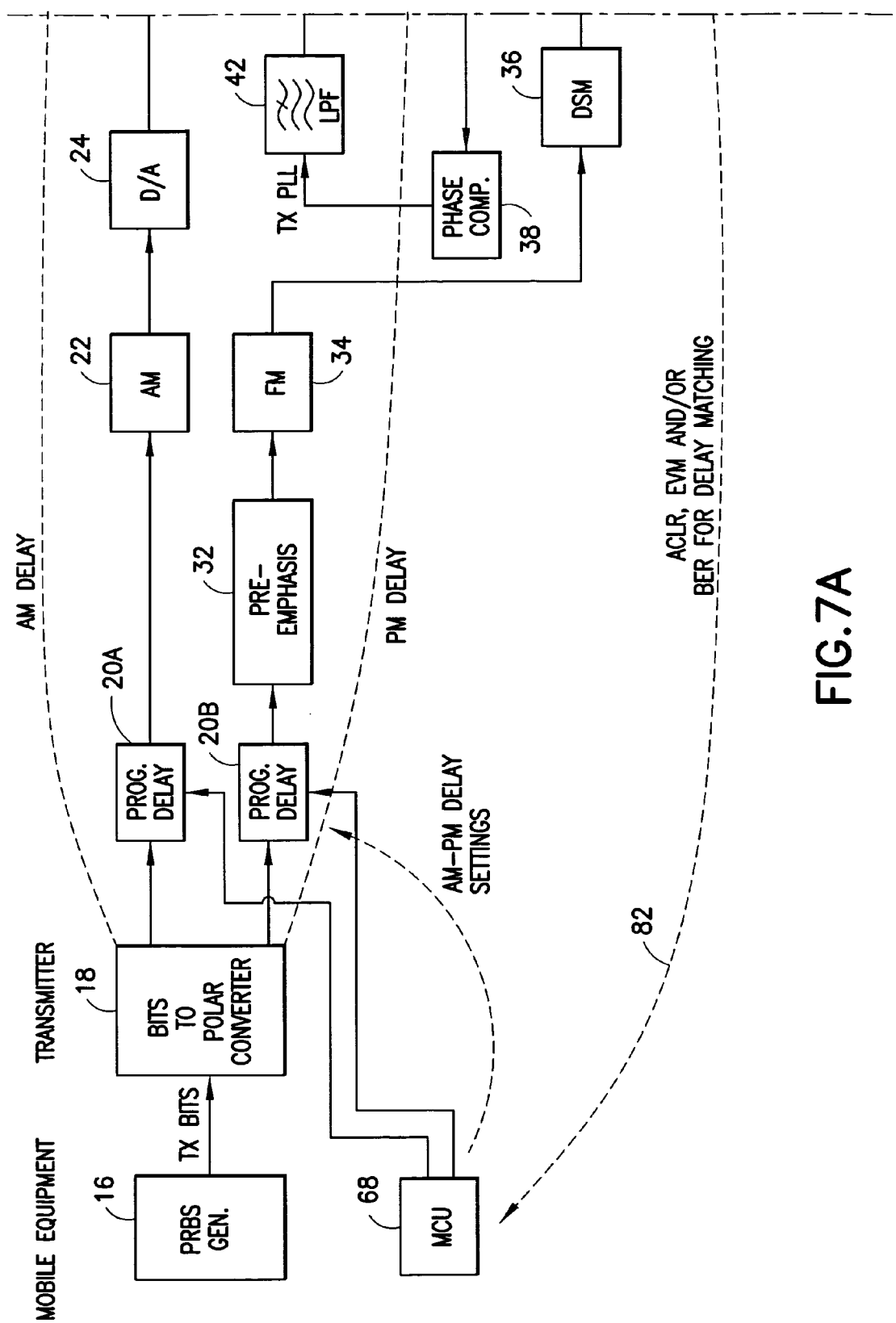
FIG. 7 is a block diagram of the EV RF transmitter, and shows AM-PM delay matching using a production tester.

A further embodiment of this invention is illustrated in FIG. 7. In this case the TX signal is fed to an external production tester 80, or corresponding equipment, in order to measure the relevant parameters such as ACLR, EVM and/or BER. A feedback loop 82 is provided from the production tester 80 to the MCU 68 of the mobile station 10 for providing the measured results back to the MCU. In this case the MCU 68 is not required to program or use the RX 14, although in other respects the methods shown in FIGS. 3 and 4 can be followed without significant change. It is also within the scope of this invention to make the decision as to the optimal delay settings with the production tester 80, and to communicate the optimum value to the MCU 68 over the feedback path 82.

There are a number of advantages that can be realized by the use of this invention. First, the use of this invention provides a simple method for eliminating a known problem related to the ER TX architecture (i.e., the adverse effect on mobile station operation resulting from a delay mismatch between the AM and PM TX channels). Second, the use of this invention does not require additional IC area or external components in order to carry out the time delay calibration, only mandatory and already present circuit blocks are used. Third, the calibration algorithm executes rapidly. Fourth, the calibration algorithm is suitable for performing mobile station 10 real-time, self-calibration during talk-time in TDMA systems, such as in GSM systems.

It is noted that if the calibration loop is established in the field, then signals from and to the antenna 48 are preferably blocked in order to prevent transmitted signals from disturbing the wireless network, and to prevent received signals from interfering with the RX 14 measurement process. Blocking can be implemented using antenna switches, a metallic enclosure, or another type of antenna shield.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. As but some examples, certain blocks of the methods shown in FIGS. 3 and 4 could be placed in a different order (e.g., blocks 3B and 3C, and 4B and 4C, could be exchanged), and the TX 12 and/or RX 14 could be constructed so as to differ from the architecture shown in FIG. 2. However, all such and similar modifications of the teachings of this invention will still fall within the scope of this invention.

Further, it is within the scope of this invention to determine and store a plurality of delay values that correspond to different TX output power levels, in a manner similar to that disclosed by the above-referenced U.S. Patent Application Publication US 2002/0168020 A1, but to do so, in accordance with this invention, by making the delay effect measurements with the RX 14, as described in detail above.

Also, if one has a priori knowledge that one path (AM or PM) has a greater inherent delay than the other path, then it may be possible to place the programmable delay in the other path (i.e., in the path having less inherent delay than the other).

Thus, while the method and apparatus described herein are provided with a certain degree of specificity, the present invention could be implemented with either greater or lesser specificity, depending on the needs of the user.

Further still, some of the features of the present invention could be used to advantage without the corresponding use of other features. As such, the foregoing description should be considered as merely illustrative of the principles of the present invention, and not in limitation thereof.

What is claimed is:

1. A radio frequency (RF) transceiver comprising a transmitter (TX) and a receiver (RX) for coupling to an antenna, the transmitter configured to transmit a signal through the antenna and the receiver RX configured to receive a signal through the antenna, said TX having a polar architecture that comprises at least one programmable delay element in at least one of an amplitude modulation (AM) path and a phase modulation (PM) path, further comprising an RF connection between an output of said TX and an input of said RX, and a controller that is responsive to an output of said RX when receiving a signal through said RF connection for determining at least one delay value for use in programming said at least one programmable delay element.

2. An RF transceiver as in claim 1, where said RX comprises means for measuring an effect of a delay mismatch between said AM path and said PM path.

3. An RF transceiver as in claim 2, where said measuring means comprises a power measurement block.

4. An RF transceiver as in claim 2, where said measuring means comprises an Adjacent Channel Leakage Ratio (ACLR) power measurement block.

5. An RF transceiver as in claim 4, where said controller determines said delay value as being a value that minimizes the ACLR.

6. An RF transceiver as in claim 4, where said RX is tuned, when receiving a signal through said RF connection, to an RX carrier frequency that is about one channel spacing away from a TX carrier frequency.

7. An RF transceiver as in claim 2, where said measuring means comprises an Own-Channel Power (OCP) measurement block.

8. An RF transceiver as in claim 7, where said controller determines said delay value as being a value that maximizes the OCP.

9. An RF transceiver as in claim 7, where said RX is tuned, when receiving a signal through said RF connection, to an RX carrier frequency that is substantially equal to a TX carrier frequency.

10. An RF transceiver as in claim 2, where said measuring means comprises a signal quality measurement block.

11. An RF transceiver as in claim 2, where said measuring means comprises a Bit Error Ratio (BER) measurement block.

12. An RF transceiver as in claim 11, were said controller determines said delay value as being a value that minimizes the BER.

13. An RF transceiver as in claim 11, where said RX is tuned, when receiving a signal through said RF connection, to an RX carrier frequency that is substantially equal to a TX carrier frequency.

14. An RF transceiver as in claim 1, where said RX comprises at least one programmable filter, and where said controller programs said filer to have characteristics that differ when receiving a signal through said RF connection than when receiving a signal through said antenna.

15. An RF transceiver as in claim 2, where said controller, during operation of said means for measuring the effect of the delay mismatch between said AM path and said PM path, programs said at least one programmable delay element so as to have a plurality of different delay values, and stores a recorded measurement value in combination with a current delay value.

16. A method to operate a radio frequency (RF) transceiver for coupling to an antenna, said RF transceiver including an envelope restoration (ER) transmitter (TX) and a receiver (RX), comprising:
configuring said RX to receive a transmitted signal through the antenna;
providing said TX with at least one programmable delay element in at least one of an amplitude modulation (AM) path and a phase modulation (PM) path;
making an RF connection between an output of said TX and an input of said RX; and
responsive to an output of said RX when receiving a signal from said TX through said RF connection, determining at least one delay value for use in programming said at least one programmable delay element.

17. A method as in claim 16 where making an RF connection further comprises measuring an effect of a delay mismatch between said AM path and said PM path for use in determining said at least one delay value.

18. A method as in claim 17, where measuring performs a power measurement.

19. A method as in claim 17, where measuring performs an Adjacent Channel Leakage Ratio (ACLR) power measurement.

20. A method as in claim 19, where said delay value is determined as being a value that minimizes the ACLR.

21. A method as in claim 19, further comprising tuning said RX, when receiving a signal through said RF connection, to an RX carrier frequency that is about one channel spacing away from a TX carrier frequency.

22. A method as in claim 17, where measuring performs an Own-Channel Power (OCP) measurement.

23. A method as in claim 22, where said delay value is determined as being a value that maximizes the OCP.

24. A method as in claim 22, further comprising tuning said RX, when receiving a signal through said RF connection, to an RX carrier frequency that is substantially equal to a TX carrier frequency.

25. A method as in claim 17, where measuring performs a signal quality measurement.

26. A method as in claim 17, where measuring performs a Bit Error Ratio (BER) measurement.

27. A method as in claim 26, where said delay value is determined as being a value that minimizes the BER.

28. A method as in claim 26, further comprising tuning said RX, when receiving a signal through said RF connection, to an RX carrier frequency that is substantially equal to a TX carrier frequency.

29. A method as in claim 16, where said RX comprises at least one programmable filter, further comprising programming said filter to have characteristics that differ when receiving a signal through said RF connection than when receiving a signal through said antenna.

30. A method as in claim 17, where measuring the effect of the delay mismatch between said AM path and said PM path comprises programming said at least one programmable delay element so as to have a plurality of different delay values, and storing a recorded measurement value in combination with a current delay value.

31. A method to calibrate a radio frequency (RF) transceiver that includes an envelope restoration (ER) transmitter (TX) and a receiver (RX), comprising:
providing said TX with at least one programmable delay element in at least one of an amplitude modulation (AM) path and a phase modulation (PM) path;
making an RF connection between an output of said TX and an input of an external test apparatus; and
responsive to an output of said external test apparatus when receiving a signal through said RF connection, determining at least one delay value for use in programming said at least one programmable delay element.

32. A method as in claim 31 where making an RF connection further comprises measuring an effect of a delay mismatch between said AM path and said PM path for use in determining said at least one delay value.

33. A method as in claim 32, where measuring performs at least one of a power measurement and a signal quality measurement.

34. A method as in claim 32, where measuring performs at least one of: an Adjacent Channel Leakage Ratio (ACLR) power measurement, where said delay value is determined as being a value that minimizes the ACLR; an Own-Channel Power (OCP) measurement, where said delay value is determined as being a value that maximizes the OCP; and a Bit Error Ratio (BER) measurement, where said delay value is determined as being a value that minimizes the BER.

35. A method as in claim 32, where measuring comprises one of outputting measurement results from said external test apparatus, and determining the at least one delay value for use in programming said at least one programmable delay element based on the outputted measurement results, or determining within the external test apparatus the at least one delay value based on the measurement results, and outputting the at least one delay value from the external test apparatus.

* * * * *